(12) United States Patent
Lien

(10) Patent No.: US 7,398,487 B1
(45) Date of Patent: Jul. 8, 2008

(54) PROGRAMMABLE LOGIC DEVICE-STRUCTURED APPLICATION SPECIFIC INTEGRATED CIRCUIT

(75) Inventor: Scott Te-Sheng Lien, Palo Alto, CA (US)

(73) Assignee: XILINX, Inc., San Jose, CA (US)

( * ) Notice: Subject to any disclaimer, the term of this patent is extended or adjusted under 35 U.S.C. 154(b) by 380 days.

(21) Appl. No.: 11/205,528

(22) Filed: Aug. 16, 2005

(51) Int. Cl.
*G06F 17/50* (2006.01)
(52) U.S. Cl. .............................. 716/3; 716/1
(58) Field of Classification Search .............. 716/1, 716/3
See application file for complete search history.

(56) References Cited

U.S. PATENT DOCUMENTS

| | | | |
|---|---|---|---|
| 5,182,727 | A | 1/1993 | McFalls, Jr. et al. |
| 5,550,839 | A | 8/1996 | Buch et al. |
| 5,642,058 | A | 6/1997 | Trimberger et al. |
| 5,682,107 | A | 10/1997 | Tavana et al. |
| 5,815,405 | A | 9/1998 | Baxter |
| 6,002,268 | A | 12/1999 | Sasaki et al. |
| 6,281,704 | B2 | 8/2001 | Ngai et al. |
| 6,311,316 | B1 * | 10/2001 | Huggins et al. ............... 716/12 |
| 6,515,509 | B1 | 2/2003 | Baxter |
| 6,625,787 | B1 | 9/2003 | Baxter et al. |
| 6,625,788 | B1 | 9/2003 | Vashi et al. |
| 7,038,490 | B1 * | 5/2006 | Singh et al. .................... 326/41 |

OTHER PUBLICATIONS

The Programmable Logic Data Book, available from Xilinx, Inc., 2100 Logic Drive, San Jose, California 95124, published Jan. 1998, pp. 4-46 to 4-59.
Altera, "HardCopy Series Handbook", pp. 2-1 through 6-10, vol. 1, available from Altera Corporation, 101 Innovation Drive, San Jose, CA 95134.
Altera, "Structured ASIC Design Flow", pp. 1-2, available from Altera Corporation, 101 Innovation Drive, San Jose, CA 95134 or Http://www.altera.com/products/software/flows/asic/qts-structures_asic.html.

* cited by examiner

*Primary Examiner*—Jack Chiang
*Assistant Examiner*—Brandon W Bowers
(74) *Attorney, Agent, or Firm*—W. Eric Webostad

(57) ABSTRACT

A method and apparatus for a CPLD-structured ASIC. Circuit blocks associated with a programmed portion of a CPLD are configured to preserve timing associated with instantiation of a circuit design in the programmed portion of the CPLD. The circuit blocks have predetermined placement information obtained from the CPLD, and the placement information is used to locate CPLD-structured ASIC cells associated with the circuit blocks.

20 Claims, 5 Drawing Sheets

PROGRAMMABLE LOGIC DEVICE-STRUCTURED APPLICATION SPECIFIC INTEGRATED CIRCUIT

FIELD OF THE INVENTION

One or more aspects of the invention relate generally to integrated circuits and, more particularly, to Application Specific Integrated Circuits structured with programmable logic circuits having predetermined placement.

BACKGROUND OF THE INVENTION

Programmable logic devices ("PLDs") are a well-known type of integrated circuit that can be programmed to perform specified logic functions. One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Notably, as used herein, "include" and "including" mean including without limitation.

Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

Heretofore, PLDs have been used to instantiate a design in programmable logic generally for low-volume markets. Low-volume markets conventionally are thought to be greater than two million units per year, and more generally thought to involve sales of five or more million units per year. For high volume markets, Application Specific Integrated Circuits ("ASICs") were used. However, the time to market for ASICs is slower than for a design instantiated in a PLD. To address higher volume markets with respect to FPGAs, others have suggested forming structured Application Specific Integrated Circuits ("ASICs"), such as HardCopy from Altera of San Jose, Calif. However, such structured ASICs have cost limitations with respect to commercial viability in higher-volume markets.

Accordingly, it would be desirable and useful to provide an ASIC or ASIC-like device for high volume markets with a time to market closer to that of a design instantiated in a PLD and at a lower cost than prior structured ASICs.

SUMMARY OF THE INVENTION

One or more aspects of the invention generally relate integrated circuits and, more particularly, to Application Specific Integrated Circuits structured with programmable logic circuits having predetermined placement.

An aspect of the invention is a method for porting a circuit design instantiated in a Complex Programmable Logic Device to an Application Specific Integrated Circuit. The circuit design as instantiated in the Complex Programmable Logic Device is resolved into a circuit listing. Circuit blocks are selected from a database responsive to the circuit listing. The database includes component representations associated with the Complex Programmable Logic Device, and the circuit blocks selected include predetermined placement information therefore. Integrated circuit information is generated responsive to the circuit blocks selected. The integrated circuit information includes the placement information, and the placement information is predetermined from placement of the circuit blocks as previously placed for the Complex Programmable Logic Device. The integrated circuit information is usable for forming a structured Application Specific Integrated Circuit having the circuit blocks selected placed responsive to the placement information. Another aspect of the invention is an Application Specific Integrated Circuit. Circuit blocks are associated with a programmed portion of a Complex Programmable Logic Device. The circuit blocks are configured to preserve timing associated with instantiation of a circuit design in the programmed portion of the Complex Programmable Logic Device. The circuit blocks have predetermined placement information obtained from the Complex Programmable Logic Device, and the placement information is used to locate Complex Programmable Logic Device-structured Application Specific Integrated Circuit cells associated with the circuit blocks.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1A:
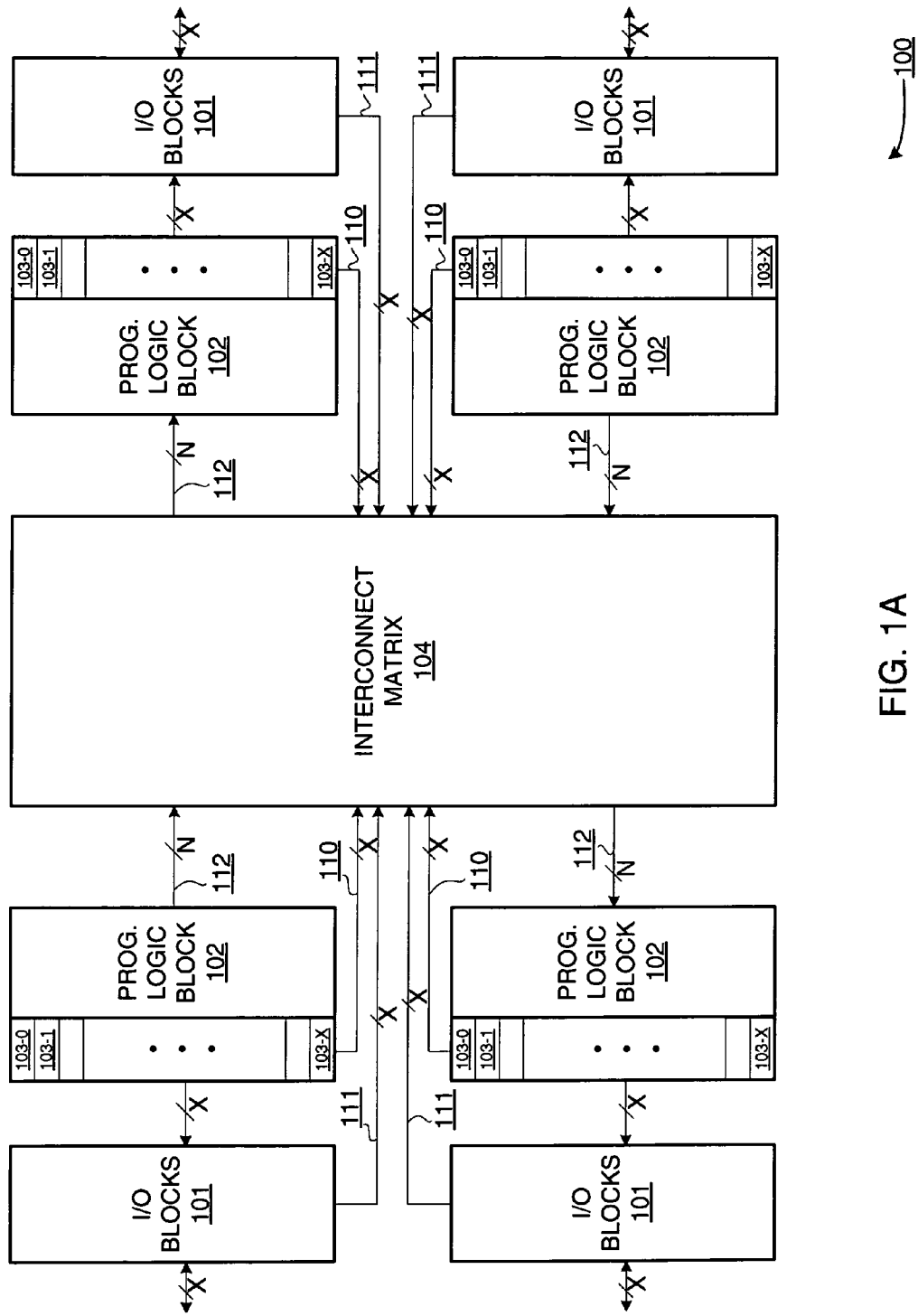
FIG. 1A is a simplified block diagram depicting an exemplary embodiment of a Complex Programmable Logic Device ("CPLD") architecture.

FIG. 1A is a simplified block diagram depicting an exemplary embodiment of a Complex Programmable Logic Device ("CPLD") architecture 100. Notably, though a CPLD architecture 100 is described for purposes of clarity by way of example, it should be appreciated that other types of programmable logic devices may be used. A user design may be instantiated in CPLD architecture 100. It should be appreciated that CPLD architecture 100 includes groups of types of circuits, as is known. Examples of such groups of types of circuits include input/output ("I/O") ports, buffers, AND gates, OR gates, and flip-flops.

CPLD architecture 100 includes programmable logic blocks 102. Notably, although four programmable logic blocks 102 are illustratively shown in FIG. 1A, fewer or more programmable logic blocks 102 may be used. Each programmable logic block 102 is coupled to I/O blocks 101 via macrocells 103-0 through 103-X ("macrocells 103"), for X a positive integer greater than zero. Macrocells 103 may be coupled to an interconnect matrix 104 via feedback paths 110. Notably for X macrocells 103, there may be X corresponding feedback paths 110. Furthermore, I/O blocks 101 may be coupled to interconnect matrix 104 via feedback paths 111. Again, there may be X feedback paths 111 corresponding to the number of macrocells 103. Programmable logic blocks 102 may be coupled to interconnect matrix 104 via inputs 112 having an associated direction of flow, as illustratively shown for CPDL architecture 100. There may be N inputs 112 for N a positive integer greater than zero.

Conventionally, programmable logic block 102 is an array of programmable AND/OR gates ("gate array"). The gate array may be programmable and reprogrammable to provide a variety of logic functions. Macrocells 103 are functional blocks configured to perform combinatorial or sequential operations, and may be use true or complimented logic. Furthermore, feedback paths may be implemented. An example of CPLD architecture 100 is a CoolRunner-II CPLD available from Xilinx of San Jose, Calif. Notably, other CPLD architectures may be used even though an example architecture is provided here for purposes of clarity.

Figure 1B:
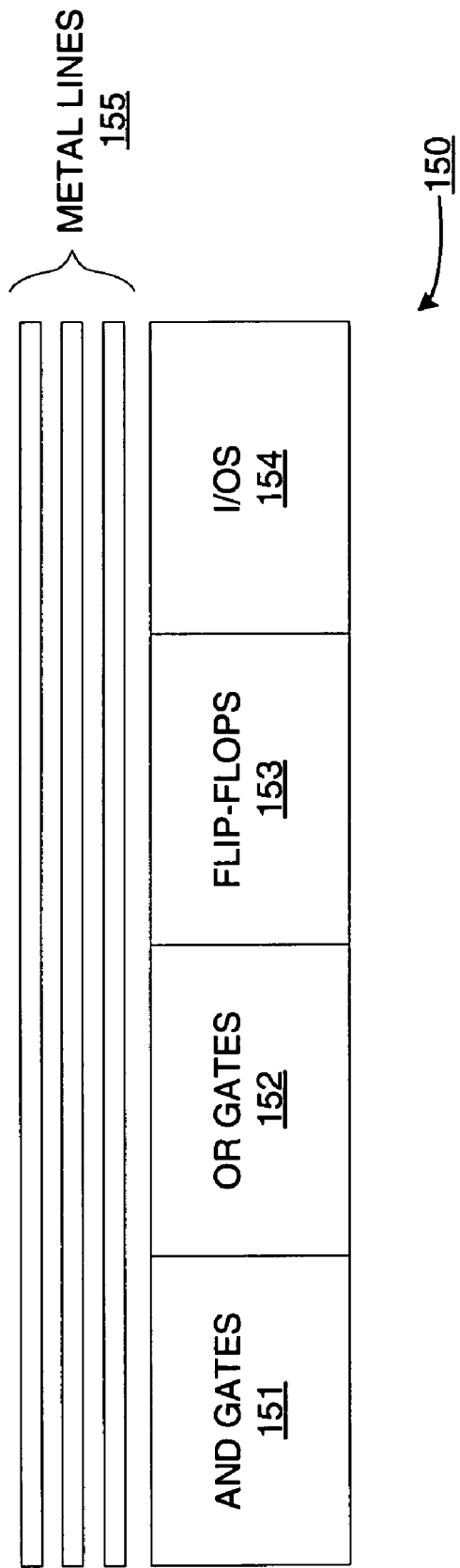
FIG. 1B is a high-level block diagram depicting an exemplary embodiment of a structured CPLD.

FIG. 1B is a high-level block diagram depicting an exemplary embodiment of a structured CPLD 150. Structured CPLD 150 includes groupings of logic, namely groups 151 through 154. Group 151 is illustratively shown as a grouping of AND gates. Group 152 is illustratively shown as a grouping of OR gates. Group 153 is illustratively shown as a grouping of flip-flops. Group 154 is illustratively shown as a grouping of I/Os. Notably, components of a CPLD need not be limited to these groupings, nor do such groupings need to be limited to only one type of component. However, these groupings are illustratively shown for purposes of clarity by way of example and not limitation.

Thus, for example, AND gates 151 and OR gates 152 may be associated with programmable logic blocks 102 of FIG. 1A; flip-flops 153 may be associated with macrocells 103 of FIG. 1A; I/Os 154 may be associated with I/O blocks 101 of FIG. 1A; and metal lines 155 may be associated with lines or paths, such as paths 111 and inputs 112 for example as illustratively shown in FIG. 1A, used to interconnect such CPLD components. Notably, for a structured ASIC formed using CPLD components, interconnect matrix 104 will be generally replaced with hardwiring, and thus a programmable interconnect matrix 104 and its associated overhead is essentially removed.

Notably, a distinguishing feature between a structured ASIC versus a customized ASIC is that in the former components are pre-placed. In other words, only the routing need be done for such pre-placed components for hardwiring. In contrast, in a customized ASIC components are not pre-placed, and thus placement and routing is done.

Thus, for example, AND gates of AND gates 151 are pre-placed as taken from a structured CPLD in forming a structure ASIC using such pre-placed CPLD AND gates. As illustratively shown in FIG. 1A with reference to programmable logic blocks 102, such AND gates may be pre-placed in particular regions or blocks. Thus, in forming a structured ASIC from a structured CPLD, placement of CPLD components used in a design instantiated in such CPLD may be mirrored from the CPLD to the structured ASIC layout. Furthermore, dedicated lines between CPLD components may be mirrored from the CPLD to the structured ASIC layout, and thus a portion of the ASIC layout may be pre-routed by porting such lines from the structured CPLD. However, as programmable interconnect matrix 104 of FIG. 1A is replaced with hardwired routing, such programmable interconnect matrix 104 is not ported in its entirety. However, timing of signals through interconnect matrix may be generally preserved by porting interconnect lines used in the structured ASIC layout, which may include portions of such lines from programmable interconnect matrix 104 of FIG. 1A.

Figure 2:
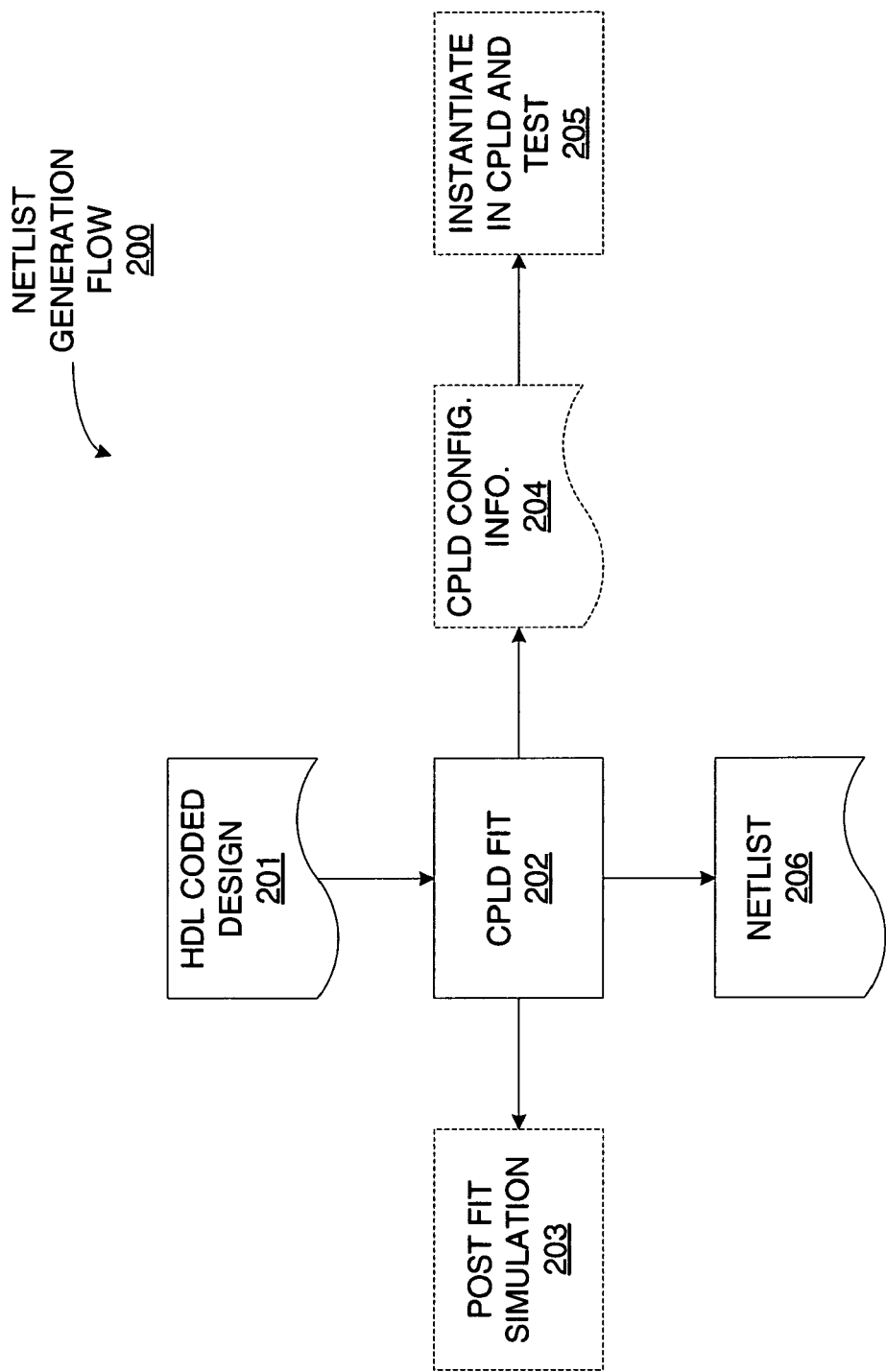
FIG. 2 is a flow diagram depicting an exemplary embodiment of a network list ("netlist") generation flow.

FIG. 2 is a flow diagram depicting an exemplary embodiment of a network list ("netlist") generation flow 200. At 202, a CPLD fitter is used to provide a CPLD fit of a user design, such as a hardware description language ("HDL") coded design 201. An HDL coded design 201 may be instantiated in a CPLD, such as CPLD architecture 100 of FIG. 1A, via a CPLD fitter as is known. Optionally, at 203 a post-fit simulation of such HDL coded design 201 may be run to ensure proper operation of such design. The simulation model used at 203 need not include unused CPLD resources, which are identified as a result of filling an HDL coded design 201 into a CPLD at 202.

Once it is determined that the design operates as intended as determined at 203, then configuration information associated with such post fit simulation 203 output from CPLD fitter 202 may be used for an optional actual instantiation in a CPLD for subsequent testing at 205. Thus, the HDL coded design 201 may be simulated after fitting and subsequently instantiated in a CPLD at 205 for testing to verify proper operation.

Once a user has determined that an HDL coded design 201 operates as intended, a netlist 206 responsive to the CPLD instantiation done at CPLD fit 202 may be generated. It should be appreciated that the netlist 206 includes listings of CPLD structures. Thus, netlist 206 is different from HDL coded design 201, as equivalent CPLD circuitry is represented in netlist 206 as opposed to a schematic implementation of a user design.

For example, an HDL coded design 201 built using a post-fit simulation model at 203 may use circuit elements found in cell-based Application Specific Integrated Circuit ("ASIC") manufacturing. These ASIC cells may be configured to have the same or substantially the same timing parameters as in post-fit simulation timing, such that a resulting ASIC will have same timing as HDL coded design 201 instantiated in a CPLD, such as at 205. Notably, although the same timing may be maintained between CPLD operation and ASIC operation, die size of the ASIC is less than that of the CPLD as fewer circuits are used. Furthermore, die size of the ASIC may consume less power than the CPLD as fewer circuits are used.

Figure 3:
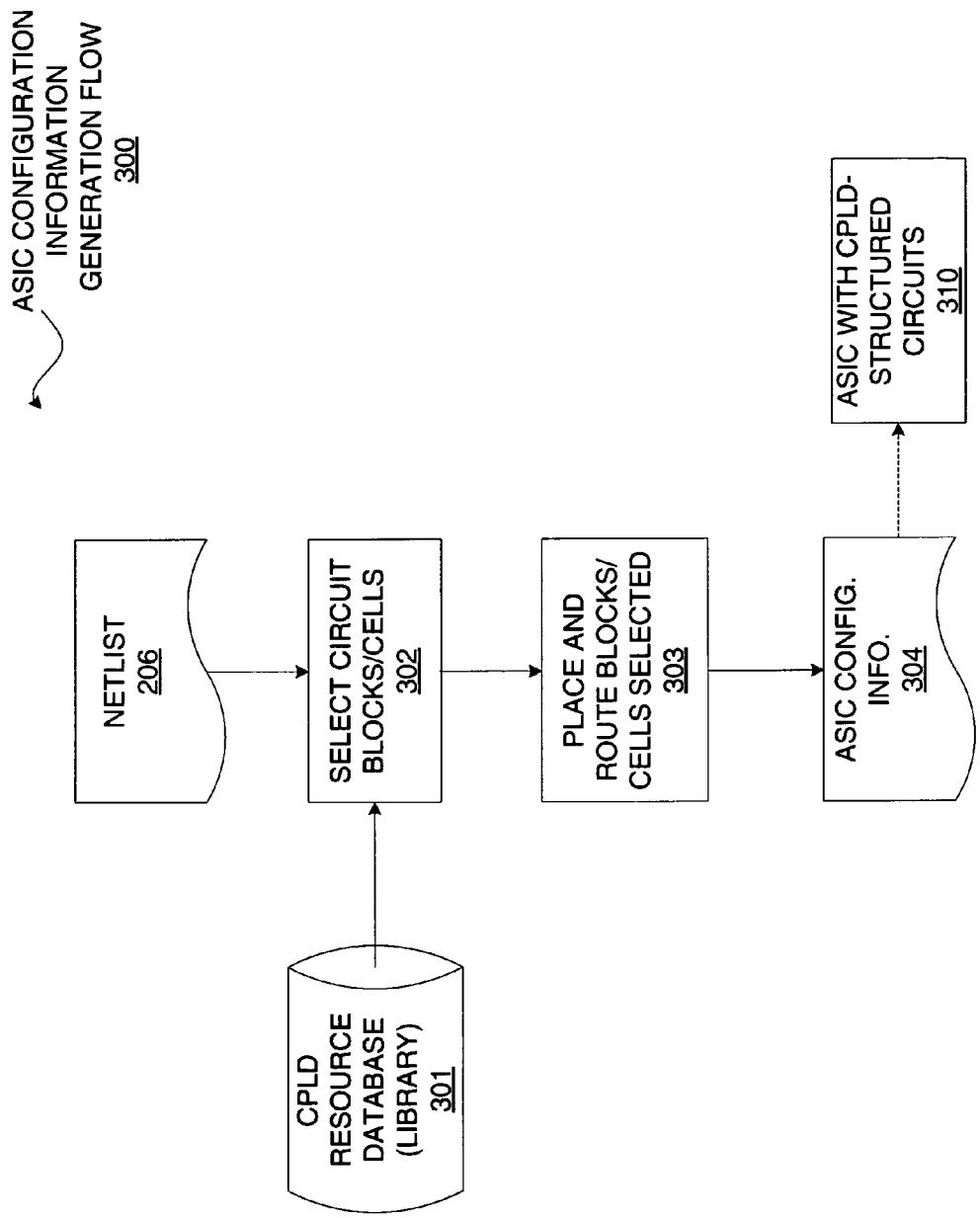
FIG. 3 is a flow diagram depicting an exemplary embodiment of an Application Specific Integrated Circuit configuration information generation flow.

FIG. 3 is a flow diagram depicting an exemplary embodiment of an ASIC configuration information generation flow 300. Again, it should be appreciated that an HDL coded design 201 or other form of circuit design is resolved into a netlist 206 or other circuit listing in association with CPLD circuitry. Thus, continuing the above example, netlist 206 is used to select CPLD circuit blocks or logic cells at 302 from a CPLD resource database 301 or other type of library associated with CPLD programmed resources. For example, six multiple input AND gates may be coupled to an OR gate as part of a CPLD logic cell. If such a cell was identified in netlist 206, a synthesized version of such cell would be obtained from CPLD resource library 301. Accordingly, selection of logic cells at 302 effectively maps netlist 206 to CPLD resources in CPLD resource database 301. These mapped CPLD resources are placed and routed at 303. In other words, CPLD logic cells selected at 302 are placed and routed for forming an ASIC. Such ASIC configuration information 304 may be provided responsive to placement and routing of such CPLD cells selected. ASIC configuration information 304 may be provided to generate mask information to provide one or more masks for generating an ASIC, such as an ASIC 310 having "CPLD-structured" circuits. By "CPLD-structured" circuits, it is generally meant a structure of programmed circuits of programmable logic of a CPLD. These CPLD-structured circuits are placed in corresponding locations of a structured ASIC layout responsive to their original placement in a CPLD in which HDL coded design 201 of FIG. 2 was fitted or instantiated. In other words, CPLD-structured circuits are effectively pre-placed, and thus only routing for such pre-placed circuits may need to be done to provide hardwired interconnects for a CPLD-structured ASIC. Furthermore, it should be appreciated that a portion of such routing may be ported from the CPLD used for HDL coded design 201 of FIG. 2 to provide a degree of pre-routing.

Accordingly, it should be appreciated that an ASIC generated with CPLD structures may have a reduced cost in comparison to a complete CPLD. More specifically, fewer circuit resources, and thus a smaller integrated circuit die ("die") size in comparison to a conventional CPLD implementation, may result from porting the design, as generally not all CPLD resources are used by a design. Conventionally, resource usage of a CPLD application is less than fifty percent of the programmable logic resources of such CPLD. By not having such routing and configuration resources, actual logic of an HDL coded design 201 formed as an ASIC having CPLD structures may occupy less than thirty percent of the die space of a conventional CPLD, such as CPLD architecture 100 of FIG. 1A. Furthermore, because an ASIC is formed, the resulting product may be used in high volume markets. Thus, it should be understood that a user design, such as HDL coded design 201, may be converted to a CPLD-structured ASIC, namely an ASIC formed using pre-placed CPLD-structured circuitry as a "blueprint." This may be done with negligible, non-recurring engineering costs, as a CPLD may be used to verify operation of a design prior to porting such design to a CPLD-structured ASIC.

CPLD resource database 301 may have predetermined CPLD-structured ASIC cells or blocks, such as for I/O buffers, AND gates, OR gates, flip-flops, and combinations of one or more of any of the above, as associated with fabrication by a manufacturer, namely a manufacturer's cell library. Notably, these ASIC cells or blocks may correspond to groups 151 through 154 of FIG. 1B, as previously described. Accordingly, such CPLD-structured ASIC cells may be produced and tested to meet CPLD timing. Such CPLD timing would be the same as that in the software simulation timing model used at post-fit simulation operation 203 of FIG. 2. Thus, selection at 302, namely mapping netlist 206 to CPLD resource database 301, results in associating CPLD cells with predetermined CPLD-structured ASIC cells having the same timing. Notably, differences between CPLD cell timing and CPLD-structured ASIC cell timing may be accommodated by adding buffers.

Figure 4:
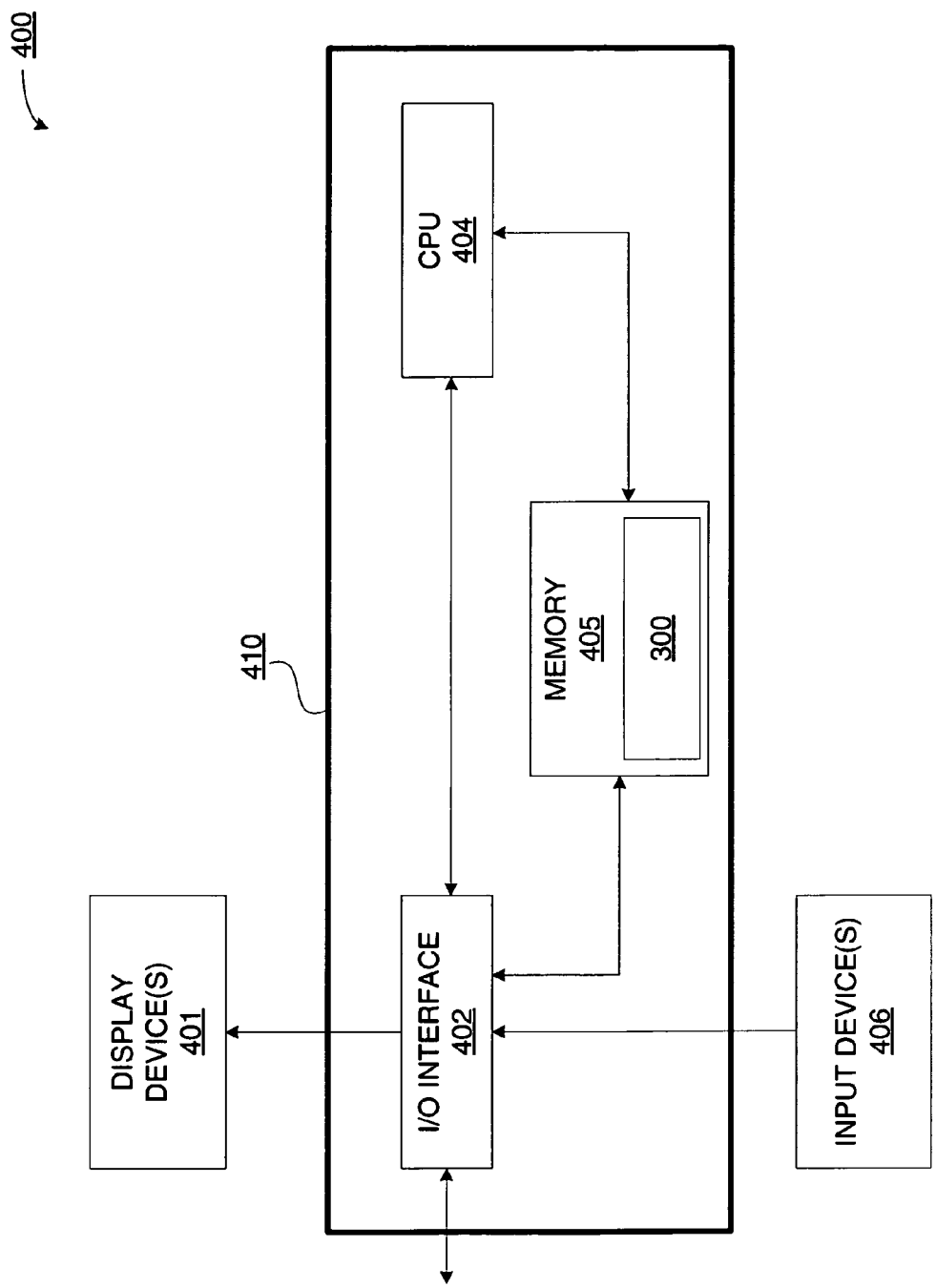
FIG. 4 is a high-level block diagram of an exemplary embodiment of a computer system.

FIG. 4 is a high-level block diagram of an exemplary embodiment of a computer system 400. Computer system 400 may include a programmed computer 410 coupled to one or more display devices 401, such as Cathode Ray Tube ("CRT") displays, Plasma displays, Liquid Crystal Displays ("LCD"), and to one or more input devices 406, such as a keyboard and a cursor pointing device. Other known configurations of a computer system may be used.

Programmed computer 410 may be programmed with a known operating system, which may be OS/2, Mac OS, Java Virtual Machine, Linux, Solaris, Unix, or a Windows operating system, among other known platforms. Programmed computer 410 includes a central processing unit ("CPU") 404, memory 405, and an input/output ("I/O") interface 402. CPU 404 may be a type of microprocessor known in the art, such as available from IBM, Intel, and Advanced Micro Devices for example. Support circuits (not shown) may include conventional cache, power supplies, clock circuits, data registers, and the like. Memory 405 may be directly coupled to CPU 404 or coupled through I/O interface 402. At least a portion of an operating system may be disposed in memory 405. Memory 405 may include one or more of the following: random access memory, read only memory, magneto-resistive read/write memory, optical read/write memory, cache memory, magnetic read/write memory, and the like, as well as signal-bearing media as described below.

I/O interface 402 may include chip set chips, graphics processors, and daughter cards, among other known circuits. An example of a daughter card may include a network interface card ("NIC""), a display interface card, a modem card, and a Universal Serial Bus ("USB") interface card, among other known circuits. Thus, I/O interface 402 may be coupled to a conventional keyboard, network, mouse, display printer, and interface circuitry adapted to receive and transmit data, such as data files and the like. Notably, programmed computer 410 may be coupled to a number of client computers, server computers, or any combination thereof via a conventional network infrastructure, such as a company's Intranet and/or the Internet, for example, allowing distributed use for interface generation.

Memory 405 may store all or portions of one or more programs or data to implement processes in accordance with one or more aspects of the invention to provide ASIC configuration information generation flow 300. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of the program product of ASIC configuration information generation flow 300, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

What is claimed is:

1. A method for porting a circuit design instantiated in a Programmable Logic Device to an Application Specific Integrated Circuit, comprising:
   resolving the circuit design as instantiated in the Programmable Logic Device into a circuit listing;
   selecting circuit blocks from a database responsive to the circuit listing, the database including component representations associated with the Programmable Logic Device, the circuit blocks selected including predetermined placement information therefor; and
   generating integrated circuit information responsive to the circuit blocks selected, the integrated circuit information including the placement information, the placement information predetermined from placement of the circuit blocks as previously placed for the Programmable Logic Device, the integrated circuit information for forming a structured Application Specific Integrated Circuit having the circuit blocks selected placed responsive to the placement information;
   wherein the circuit blocks selected responsive to the circuit listing are a subset of all programmable logic blocks of the Programmable Logic Device omitting unused ones of the programmable logic blocks resolved from instantiation of the circuit design in the Programmable Logic Device.

2. The method according to claim 1, further comprising forming the structured Application Specific Integrated Circuit responsive to the integrated circuit information generated.

3. The method according to claim 1, wherein the component representations include timing information associated with the circuit design as instantiated in the Programmable Logic Device.

4. The method according to claim 1, wherein the circuit listing includes timing information associated with the circuit design as instantiated in the Programmable Logic Device.

5. The method according to claim 4, wherein the selecting includes associating the timing information with the component representations.

6. The method according to claim 1, wherein the generating includes:
   placing the component representations using the placement information;
   placing buffers as associated with timing information of the circuit design as instantiated in the Programmable Logic Device; and
   routing interconnects for the component representations and the buffers placed.

7. The method according to claim 6, wherein the circuit design is in a hardware description language, and wherein the integrated circuit information is for generating masking layers for formation of the structured Application Specific Integrated Circuit.

8. The method according to claim 1, wherein the circuit blocks are selected from AND gates and OR gates associated with programmable logic of the Programmable Logic Device, flip-flops associated with macrocells of the Programmable Logic Device, and input/output circuits as associated with an input/output interface of the Programmable Logic Device.

9. A storage medium with machine-readable computer program code which, when executed by a processor in response to receiving a circuit design, causes execution of a method comprising:
   resolving the circuit design as instantiated in the Programmable Logic Device into a circuit listing;
   selecting circuit blocks from a database responsive to the circuit listing, the database including component representations associated with the Programmable Logic Device, the circuit blocks selected including predetermined placement information therefor; and
   generating integrated circuit information responsive to the circuit blocks selected, the integrated circuit information including the placement information, the placement information predetermined from placement of the circuit blocks as previously placed for the Programmable Logic Device, the integrated circuit information for forming a structured Application Specific Integrated Circuit having the circuit blocks selected placed responsive to the placement information;
   wherein the circuit blocks selected responsive to the circuit listing are a subset of all programmable logic blocks of the Programmable Logic Device omitting unused ones of the programmable logic blocks resolved from instantiation of the circuit design in the Programmable Logic Device.

10. The method according to claim 9, wherein the circuit blocks are selected from AND gates and OR gates associated with programmable logic of the Programmable Logic Device, flip-flops associated with macrocells of the Programmable Logic Device, and input/output circuits as associated with an input/output interface of the Programmable Logic Device.

11. The method according to claim 10, wherein the AND gates, the OR gates, the flip-flops, and the input/output circuits are grouped by component type.

12. The method according to claim 10, wherein the generating includes:
   placing the circuit blocks using the placement information;
   placing buffers as associated with timing information of the circuit design as instantiated in the Programmable Logic Device; and
   routing interconnects for the circuit blocks and the buffers placed.

13. The method according to claim 10, wherein the component representations include timing information associated with the circuit design as instantiated in the Programmable Logic Device.

14. The method according to claim 13, wherein the circuit design is in a hardware description language, and wherein the integrated circuit information is for generating masking layers for formation of an Application Specific Integrated Circuit.

15. The method according to claim 9, wherein the circuit listing includes timing information associated with the circuit design as instantiated in the Programmable Logic Device.

16. The method according to claim 15, wherein the selecting includes associating the timing information with the component representations.

17. An Application Specific Integrated Circuit, comprising:
   circuit blocks associated with a programmed portion of a Programmable Logic Device, the circuit blocks configured to preserve timing associated with instantiation of a circuit design in the programmed portion of the Programmable Logic Device, the circuit blocks having predetermined placement information obtained from the Programmable Logic Device, the placement information used to locate Programmable Logic Device-structured Application Specific Integrated Circuit cells associated with the circuit blocks;

wherein the circuit blocks associated with the programmed portion are a subset of all programmable logic blocks of the Programmable Logic Device omitting unused ones of the programmable logic blocks resolved from instantiation of the circuit design in the Programmable Logic Device.

18. The Application Specific Integrated Circuit according to claim 17, wherein the circuit blocks are selected from AND gates and OR gates associated with programmable logic of the Programmable Logic Device, flip-flops associated with macrocells of the Programmable Logic Device, and input/output circuits as associated with an input/output interface of the Programmable Logic Device.

19. The Application Specific Integrated Circuit according to claim 18, wherein the circuit blocks are selected from a library of component representations arranged in groupings by component type.

20. The Application Specific Integrated Circuit according to claim 19, wherein the component representations include timing information capable of being associated with the timing of the circuit design as instantiated in the programmed portion of the Programmable Logic Device.

* * * * *